United States Patent [19]

Yamanaka

[11] 4,054,906
[45] Oct. 18, 1977

[54] SOLID STATE COLOR CAMERA
[75] Inventor: Seisuke Yamanaka, Mitaka, Japan
[73] Assignee: Sony Corporation, Tokyo, Japan
[21] Appl. No.: 607,880
[22] Filed: Aug. 26, 1975
[30] Foreign Application Priority Data
    Aug. 29, 1974 Japan .................................. 49-99234
    Aug. 30, 1974 Japan .................................. 49-99709
[51] Int. Cl.$^2$ ............................................ H04N 9/07
[52] U.S. Cl. ........................................ 358/43; 358/44
[58] Field of Search ................. 358/43, 44, 47, 41, 358/213; 357/24, 30; 178/7.1

[56] References Cited
U.S. PATENT DOCUMENTS

| | | |
|---|---|---|
| 3,558,805 | 1/1971 | Watanabe ................................ 358/47 |
| 3,647,948 | 3/1972 | Eto et al. ................................ 358/44 |
| 3,768,888 | 10/1973 | Nishino et al. ........................ 358/47 |
| 3,869,572 | 3/1975 | Carter .................................... 178/7.1 |
| 3,909,520 | 9/1975 | Mend et al. ........................... 178/7.1 |

*Primary Examiner*—John C. Martin
*Attorney, Agent, or Firm*—Hill, Gross, Simpson, Van Santen, Steadman, Chiara & Simpson

[57] ABSTRACT

A solid state color camera wherein a charge coupled device is employed as an image sensor in association with a color filter which is so arranged that each of red and blue color information output signals from successive lines are out of phase. The output signals from two lines of the charge coupled device are combined to produce the luminance information of the composite color video signal without affecting side band components of both red and blue color information.

12 Claims, 41 Drawing Figures

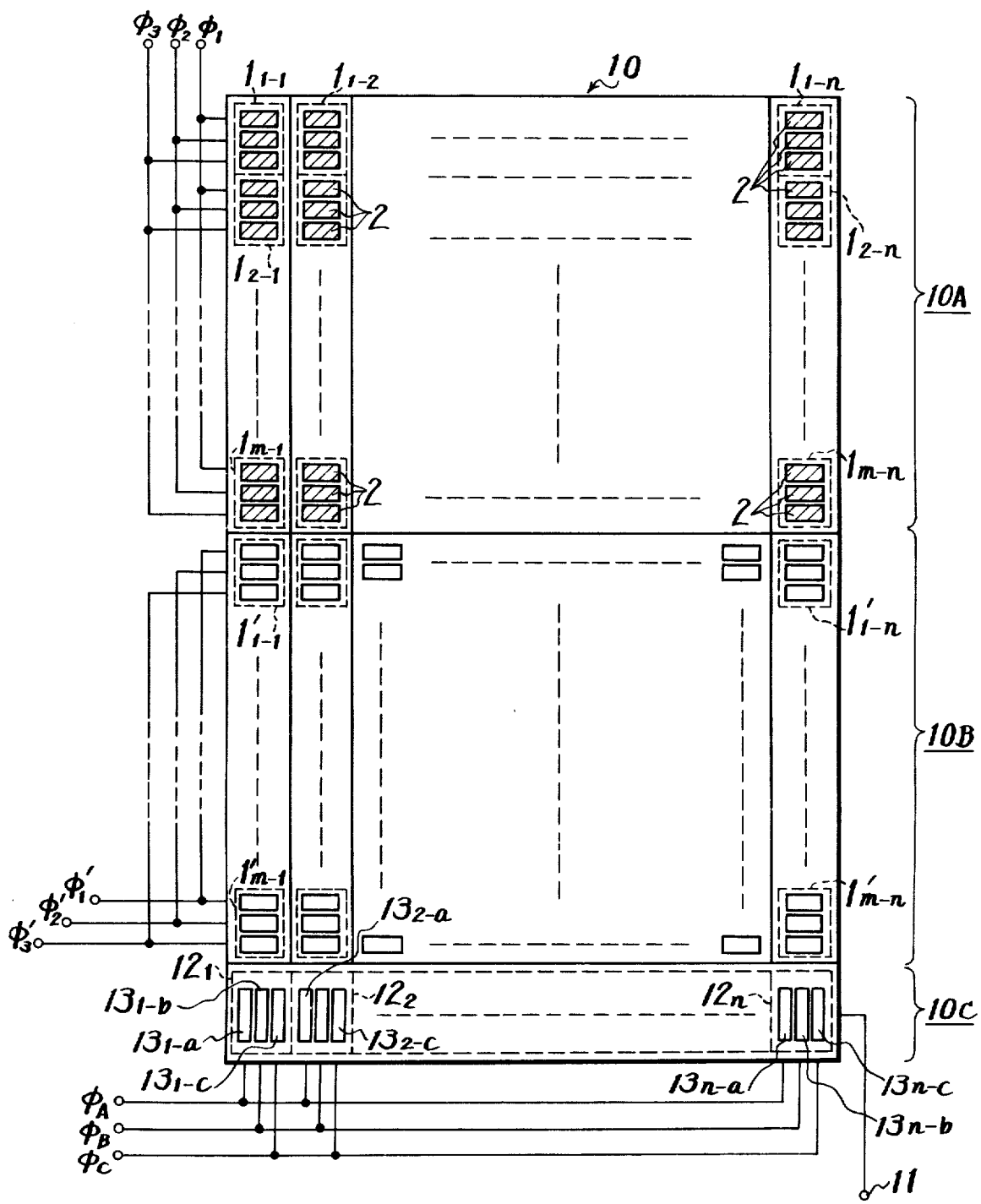

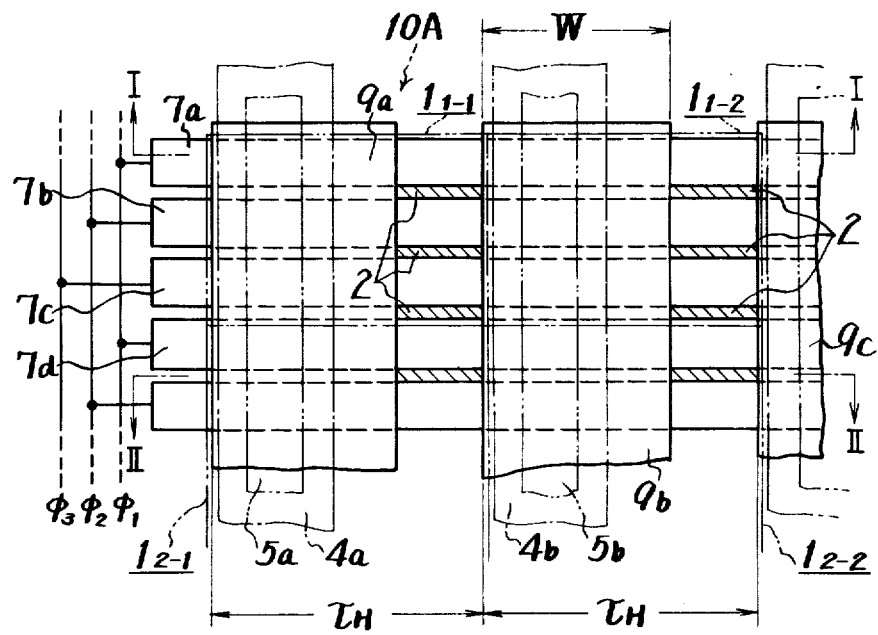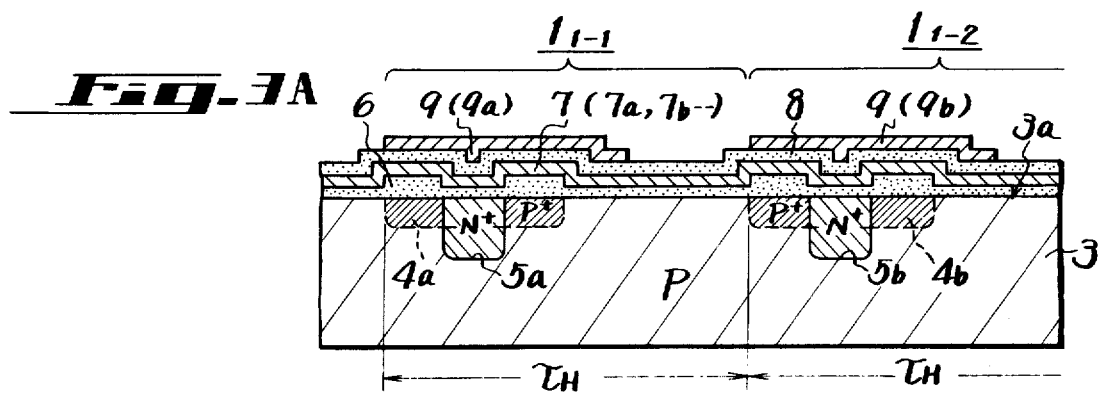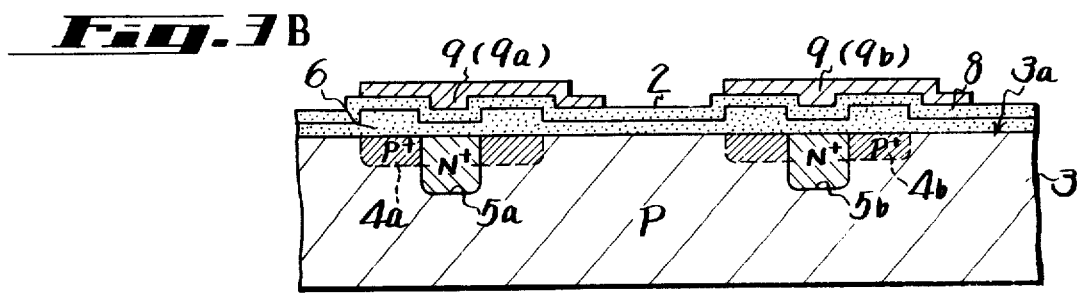

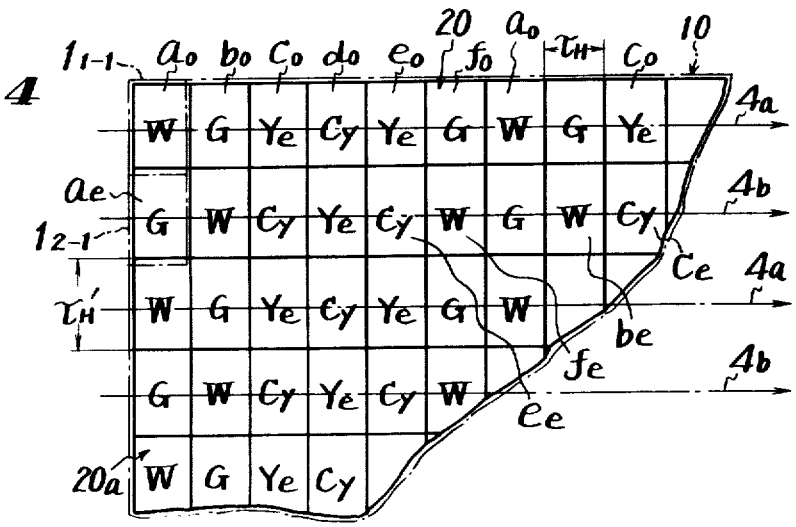
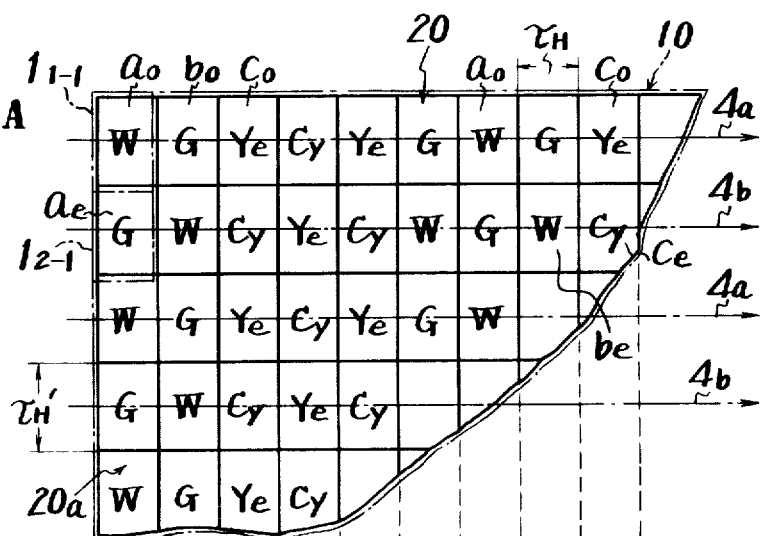

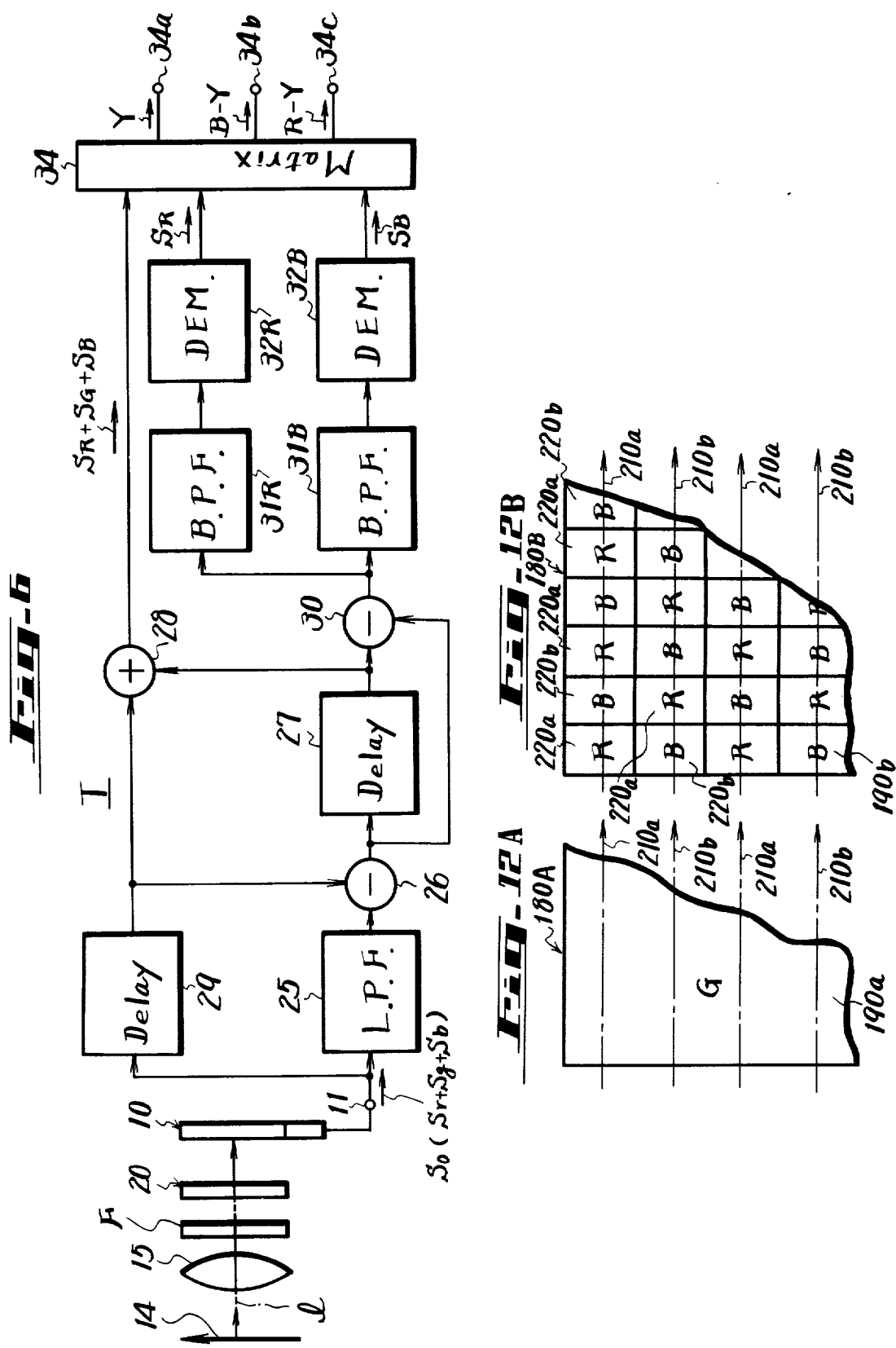

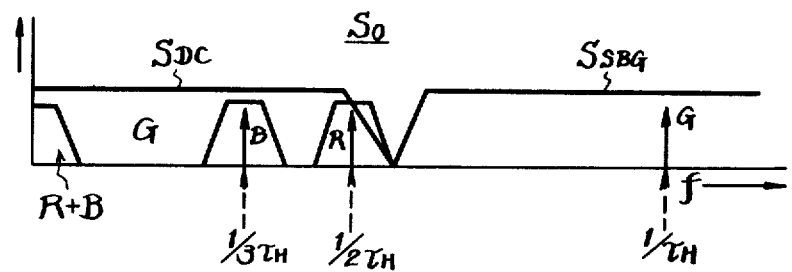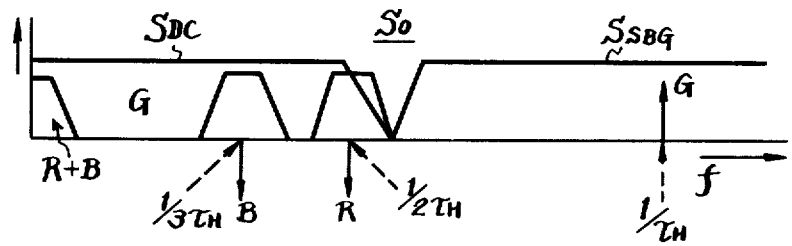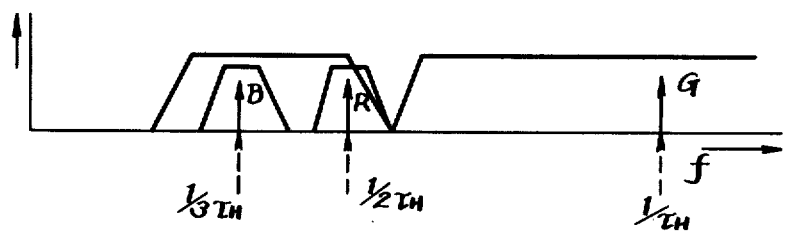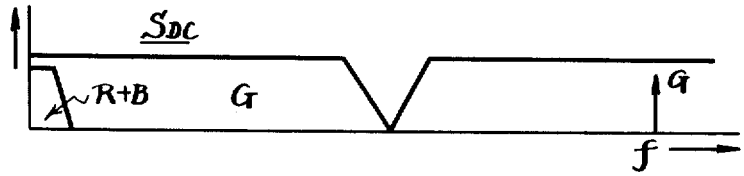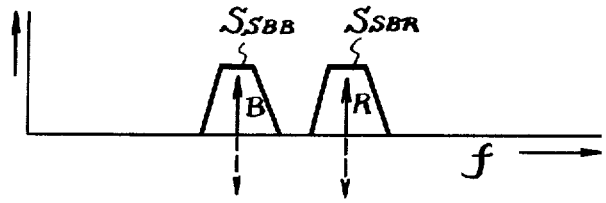

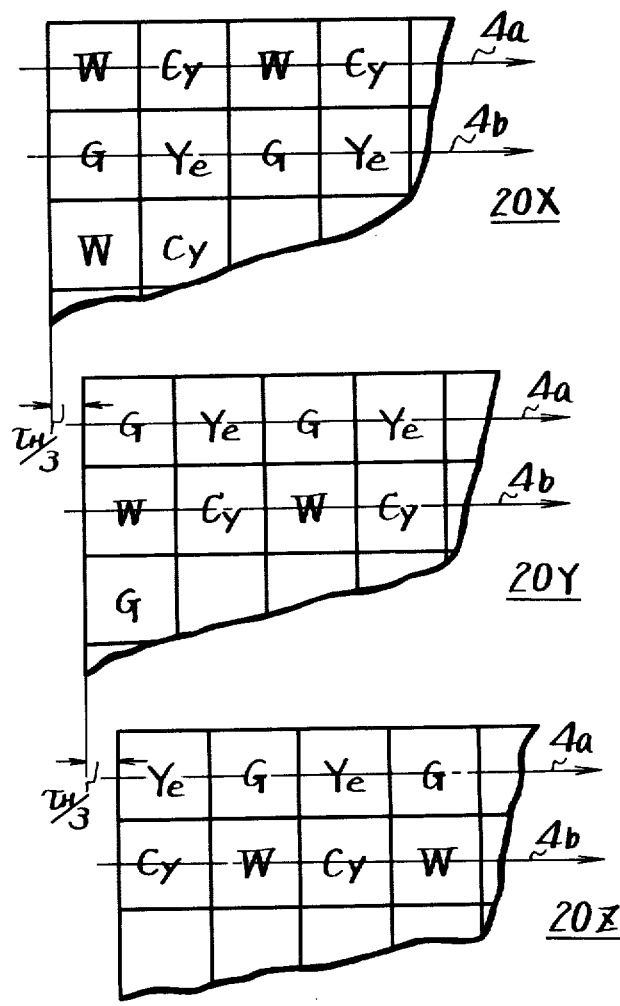
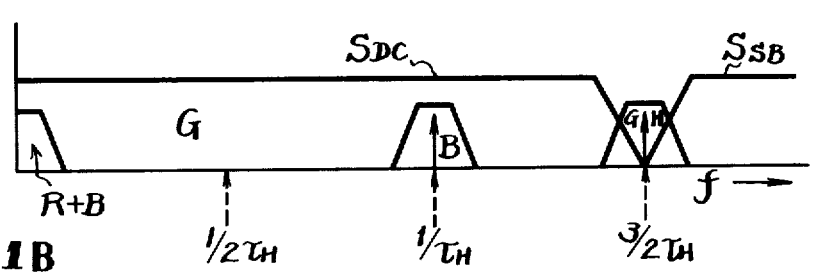
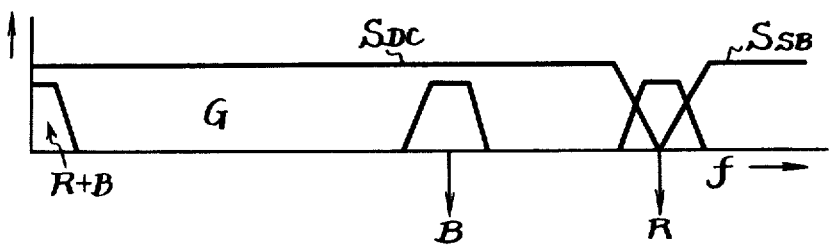

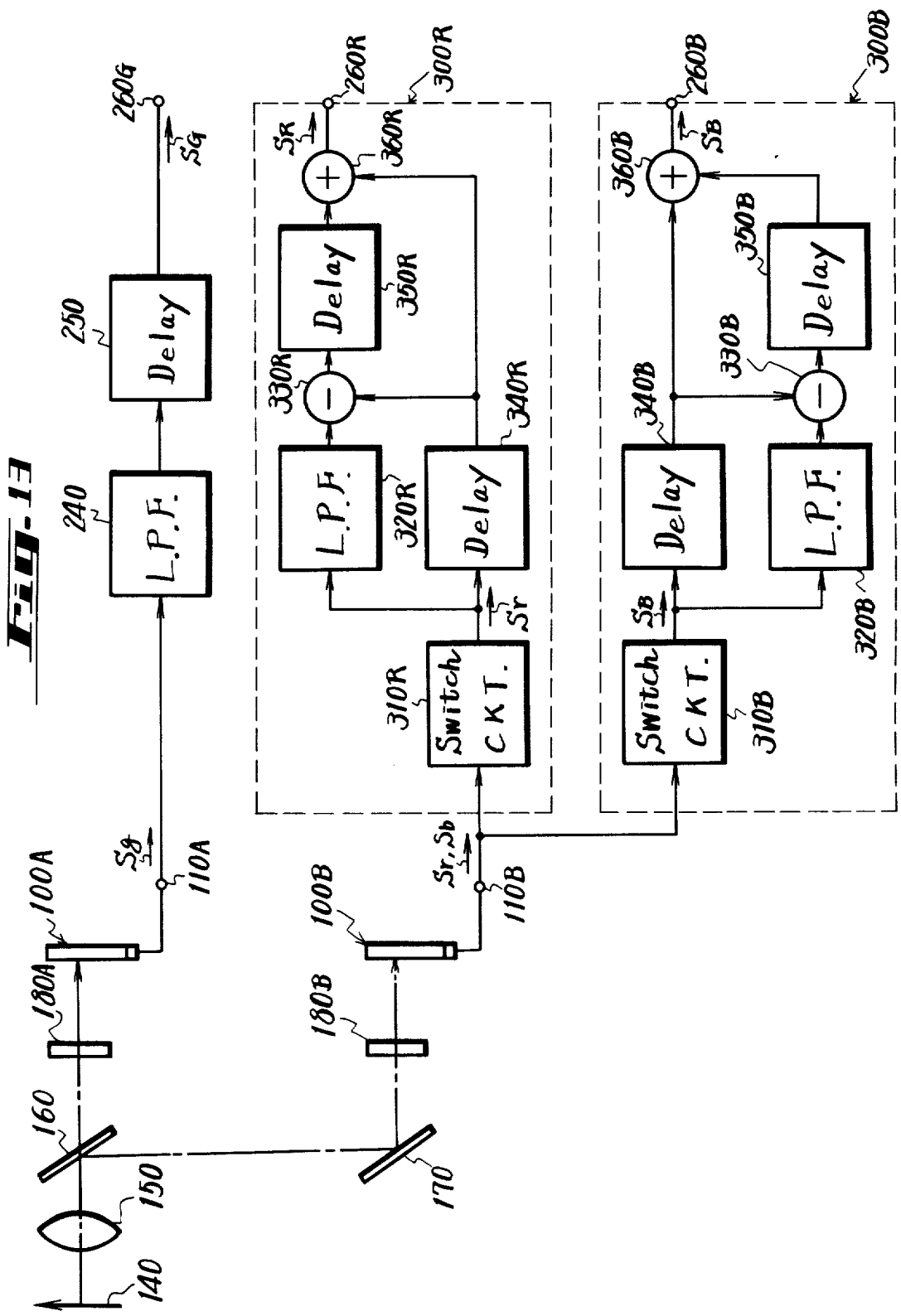

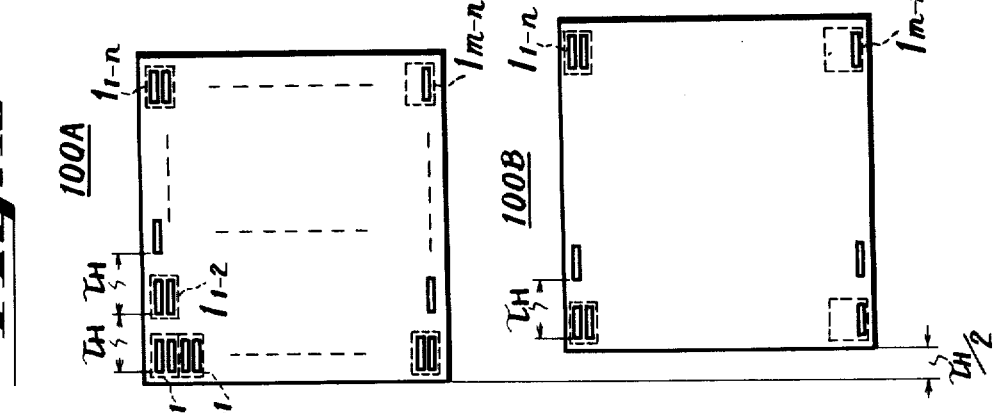
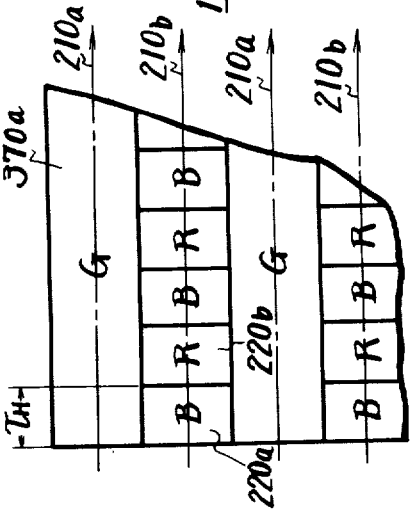
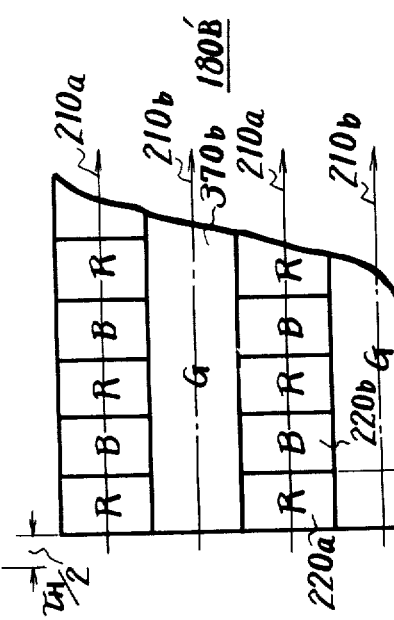

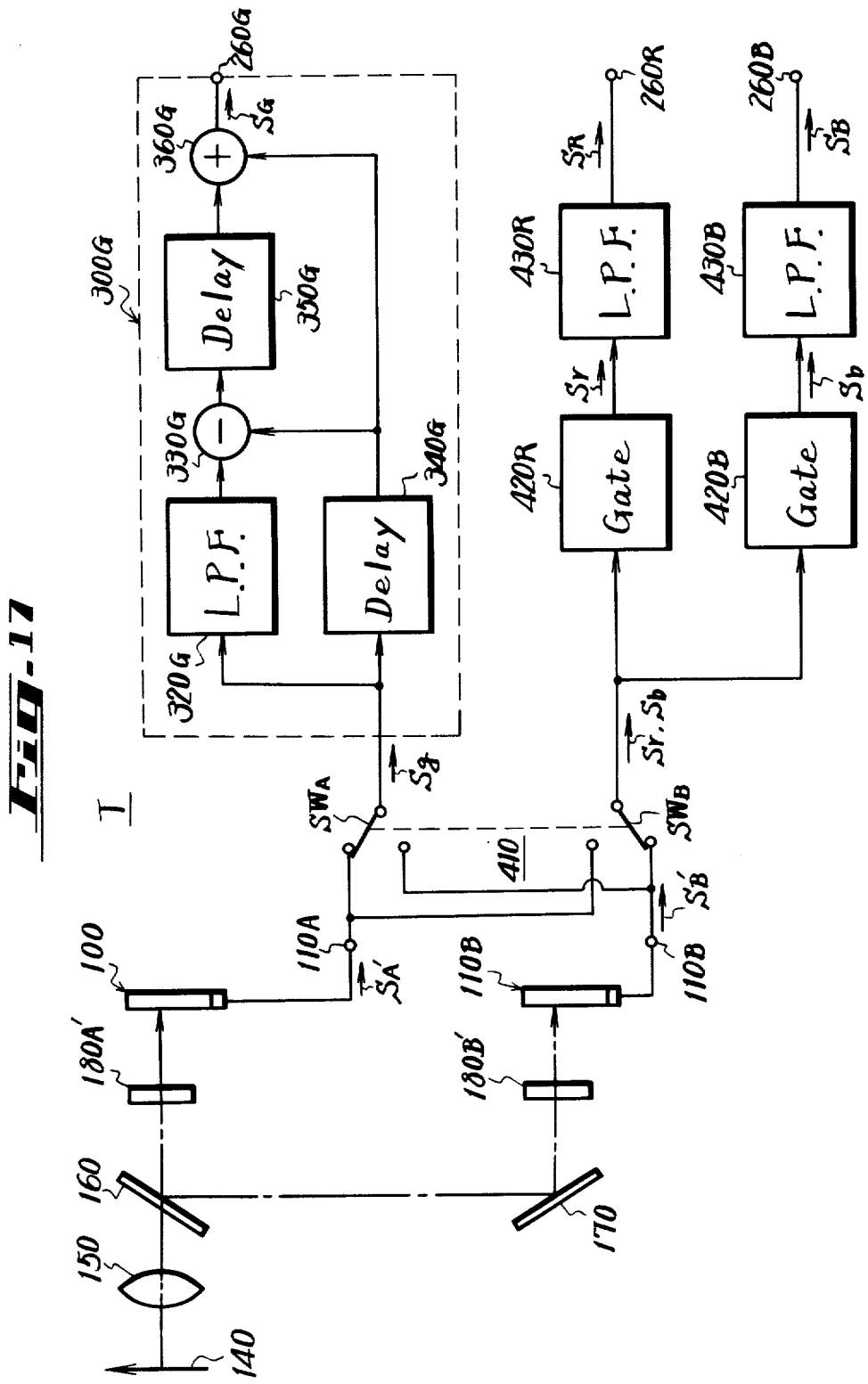

SOLID STATE COLOR CAMERA

BACKGROUND OF THE INVENTION

1. Field of the Invention

The field of art to which this invention relates is solid state color cameras and in particular to solid state color cameras using a color filter which has spacial frequencies for at least red and blue color lights.

2. Description of the Prior Art

In a solid state sensor, such as a charge coupled device (hereinfter referred to as a CCD), used as an image pickup device for a television camera, input photo or optical information corresponding to the image of an object are converted to electrical signals in response to sampling at every picture element. So in contrast to well known vidicons, output signals are sampled in a CCD at every picture element. If it is assumed that the sampling frequency is $f_c$, the alignment pitch $\tau_H$ in the horizontal direction is $1/f_c$. The electric charges stored in the respective picture elements are finally transferred to an output terminal at a rate determined by a clock pulse frequency, and the video information is derived in serial form. The resultant video signal $S_T$ contains DC components $S_{DC}$ and side band components $S_{SB}$ of the sampling frequency $f_c$ modulated with the DC components $S_{DC}$.

The side band components $S_{SB}$ are distributed above and below the sampling frequency $f_c$ which is at the center. If the frequency band of the DC component $S_{DC}$ is selected sufficiently wide so as to increase the resolution, a higher band component $S_{DH}$ of the DC component is superimposed with the side band component, and hence a certain part thereof develops a sampling error. If a picture is reproduced from such a video signal, a flicker is found in the resulting picture.

Since this flicker is caused by the sampling error, the sampling error and consequently the flicker can be avoided by restricting the frequency band of the DC component $S_{DC}$ to be smaller than one-half of the sampling frequency $f_c$. However, if the frequency band of the DC component $S_{DC}$ is restricted as above, the resolution is deteriorated. In order to make the frequency band of the DC component $S_{DC}$ about 3.5 MH$_z$ without deteriorating the resolution, the sampling frequency $f_c$ may be made high enough. The sampling frequency $f_c$ is obtained by the product of $n.f_H (f_c = n.f_H)$ where $n$ is the number of picture elements in the horizontal direction of the CCD and $f_H$ is the horizontal frequency of the television signal (practically, an effective scanning time period in the horizontal direction). If the sampling frequency $f_c$ is made so high as to remove the sampling error, the number $n$ of the picture elements must be increased correspondingly, which then results in difficulty in the manufacturing of the CCD.

SUMMARY OF THE INVENTION

It is an important feature of the present invention to provide a solid state color camera having image-sensing means which in turn has a plurality of picture elements aligned in both the horizontal and vertical directions with given alignment pitches $\tau_H$ and $\tau_H'$. Further, filter means are provided in front of the image sensing means for passing therethrough red and blue light information so that the output relating to each of the red and blue light information from the image sensing means is out of phase between successive two horizontal scanning lines. The outputs of succeeding two lines are mixed together, and thereby the side band components $S_{SB}$ of red and blue color information are eliminated or cancelled out of the DC component region. This invention is applicable to a solid state color camera using multiple image sensor means as well as a single image sensor camera.

These and other features and advantages of the present invention will be understood in greater detail from the following description and the associated drawings wherein reference numerals are utilized to designate preferred embodiments.

BRIEF DESCRIPTION OF THE DRAWINGS

FIG. 1 is a view showing a solid state image sensor used in the invention;

FIG. 2 is an enlarged view showing a part of the solid state image sensor shown in FIG. 1;

FIG. 3A is a cross-sectional view taken along the line I—I in FIG. 2;

FIG. 3B is a cross-sectional view taken along the line II—II in FIG. 2;

FIG. 4 is a view showing a part of one example of the color filter used in the invention;

FIGS. 5A to 5F, inclusive, are views used for explaining the relationship among color lights passed through the color filter shown in FIG. 4;

FIG. 6 is a systematic diagram showing an example of the invention;

FIGS. 7A to 7E, inclusive, are frequency spectrum diagrams of the video signals including the phase relationship among DC components;

FIG. 10 is a view showing parts of further embodiments of color filters which are used in the invention and which are similar to FIG. 8;

FIGS. 11A and 11B are diagrams showing the frequency spectra of the video signal associated with the color filters shown in FIG. 10;

FIGS. 12A and 12B are diagrams showing parts of color filters which are used in an embodiment of the invention which employs two CCDs;

FIG. 13 is a systematic diagram showing an association part of the invention employing the color filters shown in FIGS. 12A and 12B;

FIGS. 15A and 15B are views showing parts of a further embodiment of the color filter applicable to the invention;

FIG. 16 is a view showing the relationship between CCDs for explaining the projection state of an object to be picked up;

FIG. 17 is a systematic diagram showing a further example of the invention in which the color filters shown in FIGS. 15A and 15B are employed.

DESCRIPTION OF THE PREFERRED EMBODIMENTS

Figure 8:
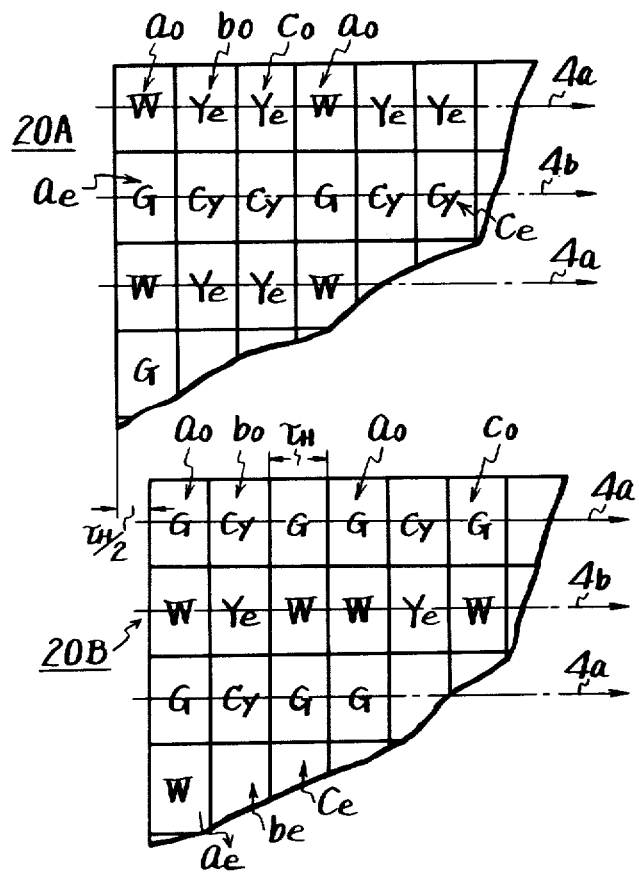
FIG. 8 is a view showing parts of color filters which are used in another embodiment of the invention.

This invention will be hereinbelow described with reference to the drawings in which 3-phase CCDs are employed, by way of example, as solid state image sensors.

In FIG. 1, a CCD 10 consists of a photo-sensitive array 10A on which an image of an object (not shown in FIG. 1) is projected, a temporary storage array 10B which stores electric charges corresponding to input photo information of the image from the photo sensitive array 10A, and a read-out register 10C for reading out the image signal. The photo-sensitive array 10A includes a predetermined number of picture elements $1_{1-1}$, $1_{1-2}, \ldots 1_{m-n}$ which are arranged in the horizontal and vertical directions with predetermined alignment pitches $\tau_H$ and $\tau_H'$ where n and m are positive integers. Each of the picture elements $1_{1-1}, 1_{1-2}, \ldots, 1_{m-n}$ have three photo-sensing units 2 which are connected with three electrodes $\phi_1$, $\phi_2$ and $\phi_3$, respectively, to form the photo-sensitive array 10A of the 3-phase CCD.

FIGS. 2, 3A and 3B show a practical example of the photosensitive array 10A including the picture elements $1_{1-1}, 1_{1-2}, \ldots 1_{m-n}$.

In FIGS. 3A and 3B, a semiconductor substrate 3 is formed of, for example, P-type conductivity material. Regions 4a, 4b, ... are formed of the same conductivity type as that of the semiconductor substrate 3 but are different in impurity concentration with the alignment pitch $\tau_H$ as channel stops or stoppers. They are formed by the diffusion method from a major or top surface 3a of the semiconductor substrate 3. In the P-type regions 4a, 4b, ... there are formed by the diffusion method, over-flow drain regions 5a, 5b, ... so as to discharge excess electrons which may be produced in the substrate 3 surrounded by the P-type regions 4a, 4b, .... The conductivity type of the regions 5a, 5b is different from that of the substrate 3, or an N-type in the illustrated example. In FIGS. 3A and 3B, an insulating layer 6 made of $SiO_2$ or the like is formed on the top surface 3a of the substrate 3 and is used in the diffusion method mentioned above.

A conduction layer 7 which is made of, for example, aluminum serves as an electrode on the insulating layer 6, that is, a first conduction layer 7a, which intersects the channel stop 4a at right angles and has a predetermined width on the horizontal plane, is formed on the insulating layer 6 and a second conduction layer 7b, whose width is same as that of the first conduction layer 7a, is also formed on the insulating layer 6 parallel to the first conduction layer 7a with a predetermined distance from the latter. Similarly, plural conduction layers 7c, 7d, ... are formed on the insulating layer 6 sequentially with respect to the vertical direction of the photo-sensitive array 20A. In this case the total number of the conduction layers 7 (7a, 7b, 7c, 7d, ...) is selected to be three times the number of picture elements which may be easily understood from the fact that the CCd 10 is 3-phase. Then, the groups of every third conduction layer (7a, 7d, ... ), (7b, 7e, ... ), ... are electrically connected and the electrodes $\phi_1$, $\phi_2$ and $\phi_3$ are led from the connected conduction layer groups, respectively, as shown in FIG. 1.

A metal layer 9, which is made of, for example, aluminum serves as an opaque body, and is formed through an insulating layer 8 made of $SiO_2$ or the like on the conduction layer 7. In this case, the metal layer 9 consists of a plurality of band-shaped strips 9a, 9b, ... each having a predetermined width W, extending in the vertical direction for covering at least each of channel stops 4a, 4b, ... respectively, but not covering the channel stops belonging to the other channels, as shown in FIG. 2. Therefore, the cross hatched portions in FIG. 2 act as photo-sensing units 2 of the respective picture elements $1_{1-1}, 1_{1-2}, \ldots 1_{m-n}$. As shown in FIG. 3B, in the photo-sensing unit 2, there is no conduction layer 7 (7a, 7b, ... ) blocking the top surface 3a of the semiconductor substrate 3.

With the photo-sensitive array 10A constructed as above, the input photo information of an image of the object causes the induction of an electric charge in the semiconductor substrate 3 corresponding to the photo-sensing unit 2 which relates to any of the electrodes $\phi_1$, $\phi_2$ and $\phi_3$ which is supplied with an image-sensing bias having a predetermined potential relation to the input photo information. Thus, if a well-known transfer clock pulse is applied to the electrodes $\phi_1$ to $\phi_3$, the electrical charge induced in each of the picture elements $1_{1-1}, 1_{1-2}, \ldots 1_{1-n}, 1_{2-1}, \ldots 1_{2-n}, \ldots 1_{m-1}, \ldots 1_{m-n}$ in the horizontal scanning lines can be stored in the temporary storage array 10B during the vertical blanking time in its corresponding horizontal scanning positions. To this end, the temporary storage array 10B is formed substantially the same as the photo-sensitive array 10A in construction, but it is of course necessary that the whole temporary storage array 10B be shielded from light, so that the parts of the temporary storage array 10B corresponding to those of the photo-sensitive array 10A are marked with the same reference numerals with a prime "1" added.

The charges stored in the temporary storage array 10B are sequentially read out with clock or sampling pulse applied to the read-out register 10C and then derived from a terminal 11 (FIG. 1) as the video signal $S_Y$. As shown in FIG. 1, the read-out register 10C comprises only read-out elements $12_1, 12_2, \ldots 12_n$ corresponding to the horizontal picture elements. In this case, the read-out is accomplished with sampling pulses $\phi_A$, $\phi_B$ and $\phi_C$ of 3-phases, so that the read-out elements $12_1, 12_2, \ldots 12_n$ have three read-out units $13_{1-a} 13_{1-b} 13_{1-c}$; $13_{2-a} 13_{2-b} 13_{2-c}$; ... respectively. Needless to say, other types of solid state image sensors, such as a photo diode array instead of CCDs could be used.

A color filter 20 which is suitable for use in the present invention will be now described with reference to FIG. 4. As shown in FIG. 4 the color filter 20 has a light permeable plane 20a divided into a plurality of areas which are substantially the same in area and each of which corresponds to each of the picture elements $1_{1-1}$ $1_{m-n}$ of the CCD 10. The divided areas of the color filter 20 are aligned in the lateral direction (horizontal scanning direction) and in the longitudinal direction (vertical scanning direction) at the alignment pitches $\tau_H$ and $\tau_H'$, respectively. In this case, the respective divided plural areas pass the desired color lights. For the sake of explanation, the light permeable sections aligned on the odd numbered horizontal scanning lines 4a are sequentially marked with $a_o, b_o, c_o, d_o, e_o, f_o, \ldots$ from the left to the right on the sheet on FIG. 4 and, similarly these aligned are on the even numbered horizontal scanning lines 4b are suquentially marked with $a_e, b_e, c_e, d_e, f_e, \ldots$ As shown in FIG. 6, in the first example of the invention, the image of an object 14 is projected through an optical lens system 15, and the color filter 20 on the CCD 10 and an electric signal in correspondence with the projected image of the object 14 is derived from the terminal 11. In this case, the color selectivities of the sections $a_o, b_o, c_o, \ldots, a_e, b_e, c_e, \ldots$ of the color filter 20 are so selected that the color signals when the picture elements $1_{1-1}$ to $1_{m-2}$ of the CCD 10 are scanned are as follows:

1. The green signal is obtained throughout the surface of the CCD 10 or the respective horizontal scanning lines.

2. The red and blue signals are obtained such that their horizontal periods are different and they are reversed in phase at every horizontal scanning period. The components of light necessary for obtaining the green signal from all over the light permeable plane 20a regardless of the arrangement of the sections $a_o, b_o, \ldots, a_e, b_e, \ldots$ are four different lights, for example, the white light, W, the yellow light, Ye, the cyan light, cy, and the green light, G. Accordingly, in the color filter 20, the respective sections are arranged for the above four lights to satisfy the previous conditions (1) and (2).

In the example of FIG. 4, the filter elements or sections $a_o$ to $f_o$ on the odd number scanning lines 4a are selected to be W-G-Ye-Cy-Ye-G, and the group of the filter elements is repeatedly arranged as a unit in the horizontal scanning direction, while the sections $a_e$ to $f_e$ on the even number scanning lines 4b are selected to be G-W-Cy-Ye-Cy-W, and the group is repeatedly arranged as a unit in the horizontal scanning direction to form the color filter 20. When the above color lights pass through the sections of the color filter 20, the above conditions are satisfied, which will be now described with reference to FIGS. 5A to 5F.

Since the green light G is previously selected as a common permeable light, a color light information having three different primary colors is taken into consideration. The green light G is obtained from throughout the surface of the color filter 20 regardless of the existence of the sections (refer to FIG. 5B), so that the condition (1) is satisfied. The red color light R is obtained from the every other sections $a_o, c_o, e_o, \ldots$, but the arrangement relationship between the Sections W and Ye which may pass therethrough the red light R is reversed at the odd and even sections. Therefore, the output relationship (light permeable relationship) on the odd numbered rows is shown in FIG. 5C, but that on the even numbered rows is shown in FIG. 5D which is reversed relative to the former in phase.

Similarly, the output relationships of the blue light, B, is shown in FIGS. 5E and 5F, respectively, in which FIG. 5E shows the output relationship on the odd numbered rows, while FIG. 5F shows that on the even numbered rows. In the case of the blue light, B, the phases of the outputs are also reversed. Also, it is apparent from a comparison of FIGS. 5E and 5F that the ratio of the width of the filter elements which pass blue light to the spacing between those filter elements is a ratio which changes from row to row.

Since the red light R is obtained from every other section, but the blue light B is obtained from every third section, their repeating frequencies $T_R$ and $T_B$ are different.

As may be apparent from the above description, if the sections of the color filter 20 are selected as shown in FIG. 4, the condition (2) can be satisfied simultaneously. With the present invention, shown in FIG. 6, the above mentioned color filter 20 and CCD 10 are employed to produce a desired color video signal.

The signal processing of the invention shown in FIG. 6 will be now described. In FIG. 6, reference numeral T generally designates a signal treating or processing circuit. Since the image of the object 14 is projected on the CCD 10 through the above color filter 20, by scanning the plural picture elements $1_{1-1}, \ldots 1_{m-n}$ of the CCD 10 there is obtained at the output terminal 11 of the CCD 10 a composite color video signal $S_o$, $S_g$ and $S_b$.

The respective signal bands will be now described. The green video signal $S_g$ which directly affects the resolution is desired to occupy a relatively wide band. In general, it is required that the band of the green video signal $S_g$ is 3.0 to 5.0 MHz, but in the invention, the band of the green video signal $S_g$ is selected 3.5 MHz so as to not cause any deterioration of the resolution. Further, in order to avoid the appearance of a sampling error which may be caused by the side band components of the signal, $S_g$, the carrier frequency ($f_c = 1/\tau_H$) is selected to be 7.0 MHz. If the bands of the red and blue video signals $S_r$ and $S_b$ are selected to be at least 500 KHz, respectively, they pose no serious problem on the resolution of color information. Therefore, in the present example of the invention, the bands of the signals $S_r$ and $S_b$ are selected as 500 KHz. The above restriction of the bands can be achieved by means of an optical filter F which is located in an optical path 1 from the object 14 to the CCD 10 as shown in FIG. 6.

FIGS. 7A to 7E show the frequency spectra and the phase relationship of the color components in the composite video signal $S_o$ which is restricted in band as described above. FIG. 7A shows the frequency spectra at the odd numbered rows, while FIG. 7B shows those at the even numbered rows, respectively. Since the horizontal period of the red video signal $S_r$ is $2\tau_H$, its carrier frequency becomes $\frac{1}{2}\tau_H$. Similarly, the carrier frequency of the blue video signal $S_b$ becomes $\frac{1}{3}\tau_H$. The signal bands and spectra are as described just above.

Returning to FIG. 6 again, the composite video signal $S_o$ is supplied to a low pass filter 25 whose cut off frequency is about 2.0 MHz. A low band component passed through the low pass filter 25 and the composite video signal $S_o$, which is not restricted in band, are supplied to a subtracter 26 which produces a subtracted signal shown in FIG. 7C. The signal from the subtracter 26 is fed to a delay circuit 27 which delays a signal applied thereto by one horizontal scanning period. The delayed signal from the delay circuit 27 and the original composite video signal $S_o$ are supplied to an adder 28. In this case, since the color signals are reversed in phase, when both signals are added, the red and blue color signals $S_r$ and $S_b$ are cancelled by each other, and hence only the DC component $S_{DC}$ appears. In other words, if the successive or adjacent video signals are added by utilization of their vertical correlation, an output signal can be obtained in which the side band components of the red and blue color signals $S_r$ and $S_b$ are eliminated as shown in FIG. 7D. In FIG. 6, a delay circuit 29 is provided to compensate for the time delay of the signal caused by the existence of the low pass filter 25.

The delayed signal from the delay circuit 27 and the signal from the subtracter 26 which is not delayed are further supplied to a subtracter 30 which extracts the red and blue color signal components only. Since side band components $S_{SBG}$ of the green signals $S_g$ in the successive or adjacent horizontal scanning periods, which green signals $S_g$ are fed to the subtracter 30, are the same in phase, the side band components $S_{SBG}$ are cancelled by subtracting the same. Similarly, the DC components $S_{DC}$ of the green signals are cancelled. As a result, only side band components $S_{SBR}$ and $S_{SBB}$ of the red and blue signals in the different horizontal periods remain as shown in FIG. 7E. Therefore, the signal from the subtracter 30 is applied to band pass filters 31R and 31B which only pass the side band components $S_{SBR}$ and $S_{SBB}$, respectively, to frequency-separate both the side band components. Then, if the output signals from the band pass filters 31R and 31B are supplied to demodulators (detectors) 32R and 32B to be demodulated, respectively, the red and blue color signals $S_R$ and $S_B$ can be obtained. When these signals $S_R$ and $S_B$ together with the signals $S_R + S_G + S_B$ from the adder 28 are supplied to a matrix circuit 34, the luminance signal Y and color difference signals B-Y and R-Y of, for example, NTSC system can be obtained at output terminals 34a, 34b, and 34c of the matrix circuit 34, respectively.

In this case, it is possible that the high-low relationship between the carrier frequencies of the red and blue signals $S_R$ and $S_B$, which are to be frequency-separated, is reversed from the above case. In such a case, it is sufficient that the filter elements Ye and Cy of the color filter 20 are exchanged.

In the above embodiment of the invention, the camera apparatus is formed of one CCD and one color filter. However, in addition to the above example, there may be considered two other examples which satisfy the above mentioned conditions (1) and (2). One of them is a camera apparatus which is formed of two CCDs and two color filters (which is referred to as a second embodiment) and the other of them is a camera apparatus which is formed of three CCDs and three color filters (which is referred to as a third embodiment).

The essential part of the second embodiment will be described firstly in which corresponding parts are marked with the same reference numerals and symbols.

FIG. 8 shows first and second color filters 20A and 20B which are used in the second embodiment. In the first color filter 20A, the odd numbered lines 4a are formed of the set of sections W-Ye-Ye which are arranged repeatedly to form the light permeable part, and the even numbered lines 4b are formed of the set of sections G-Cy-Cy which are also arranged repeatedly, as shown in FIG. 8. Similarly, in the second color filter 20B, the odd numbered lines 4a are formed of the set of sections G-Cy-G which are arranged repeatedly, and the even numbered lines 4b are formed of the set of sections W-Ye-W which are also arranged repeatedly. In this example, the first and second color filters 20A and 20B are so located that the composite video signal obtained through the first color filter 20A is reversed in phase from that obtained through the second color filter 20B so as to eliminate any sampling error. To this end, the first and second color filters 20A and 20B are disposed in space with the distance of $\tau_{H/2}$ (which corresponds to the phase difference of 180° in time point of view), and the image of the object is projected on the color filters located as described just above.

Figure 9A:
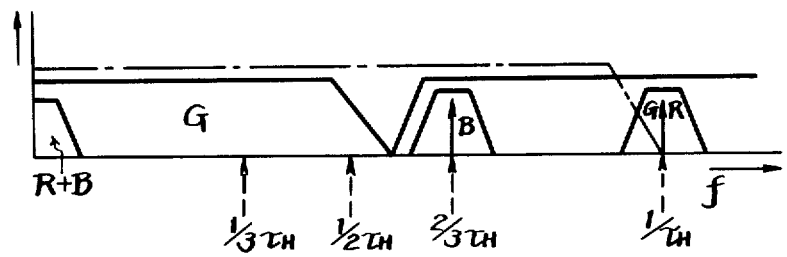
FIGS. 9A and 9B are diagrams showing the frequency spectra of the video signal when the color filters shown in FIG. 8 are used.
Figure 9B:
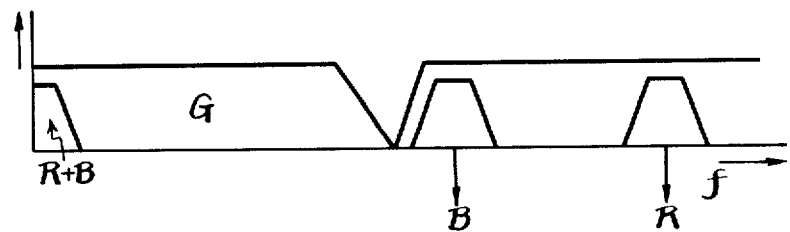

The frequency spectra and the phase relationships among the color signals of the composite video signal $S_o$ obtained from the CCDs through the above located color filters can be shown in FIGS. 9A and 9B, though their detailed description will be omitted. Accordingly, when the circuit shown in FIG. 6 and the vertical correlation are utilized for the composite video signal $S_o$, the side band components of the red and blue color signals $S_R$ and $S_B$ are cancelled and the same relationship mentioned above can be established. Since the red light R is a light which commonly passes through the color filters 20A and 20B shown in FIG. 8, its carrier frequency becomes $1/\tau_H$. The carrier frequency of the blue light B becomes $\frac{3}{2}\tau_H$ due to the fact that the carriers of the frequency $\frac{1}{2}\tau_H$ are cancelled.

In the third example, three color filters 20X, 20Y and 20Z shown in FIG. 10 are employed. In order to assure that a phase difference of 120° exists between the outputs from three CCDs corresponding to the three color filters 20X, 20Y and 20Z, the three color filters 20X, 20Y and 20Z are located with the distance of $\tau_{H/3}$ as shown in FIG. 10 and the image of the object 14 is projected on the CCDs through the color filters located as above. In the first to third color filters 20X to 20Z, the lights passed through the respective sections thereof are selected as shown in FIG. 10 though their detailed explanation will be omitted. The frequency spectra of the composite video signal from the CCDs facing the color filters 20X to 20Z are shown in FIGS. 11A and 11B. Accordingly, when the circuit shown in FIG. 6 and the vertical correlation are also used for the composite video signal produced by the third example, the same effect described above can be performed.

A still further embodiment of the invention uses tube image sensing devices and two color filters shown in FIGS. 12A and 12B to avoid the occurrence of any sampling error upon color image-pick up and to enhance the resolution in the horizontal scanning directions without increasing the number of picture elements arranged in that direction.

In this embodiment, as shown in FIG. 13, the image of an object 140 is projected through an optical lens system 150 and along optical paths shown by one-dot chain lines in FIG. 13 on a pair of CCDs 100A and 100B respectively. In FIG. 13, reference numeral 160 designates a half mirror and 170 a reflection mirror, both being disposed in the optical paths. Further, in FIG. 13, reference numerals 180A and 180B denote first and second color filters having desired color selectivities shown in FIGS. 12A and 12B. The lights passing through the first and second color filters 180A and 180B are selected to be three different primary color lights or red color light R, green color light G and blue color light B, respectively. The first color filter 180A is selected to pass at least green color light G in the above primary color lights. In this case, the color filter 180A may be formed such that the green color light G is obtained from all the color filter 180A (monochrome filter) or predetermined sections thereof. The first color filter which will be described now is the former one, that is, the whole of the filter 180A is formed to pass the green color light G, which is shown in FIG. 12A as a part 190a.

The second color filter 180B is so selected in the color selectivity that at least remaining primary color lights or the red and blue color lights R and B pass through the second color filter 180B. The color filter 180B shown in FIG. 12B passes only the red and blue color lights R and B. To this end, a light permeable plane 190b of the color filter 180B is divided into a plurality of sections corresponding to the picture elements $1_{1-1}$ to $1_{m-n}$ of the CCD. In this case, the divided areas on the odd numbered horizontal scanning lines 210a or the first, third, fifth, . . . light permeable areas or sections (first light permeable areas or sections) 220a arranged on the odd numbered horizontal scanning direction from its left to right in the sheet of FIG. 12B are selected to pass, for example, the red color light R. Accordingly, the second, fourth, sixth sections (second light permeable sections) 220b are selected to pass the blue color light B.

First and second light permeable areas or sections 220a and 220b arranged on the even numbered horizontal scanning lines 210b are selected to be the reverse of therein the odd numbered horizontal scanning lines. The reason why the lights passed through the sections at every one horizontal scanning period (1H) are made different in phase is to eliminate sampling error by utilizing vertical correlation. Since, in the color filter 180B, shown in FIG. 12B, the sections for the red and blue color lights R and B are arranged alternately, the signals at the respective horizontal scanning periods are different in phase by 180°.

If the first color filter 180A is formed as a monochrome filter, as shown in FIG. 12A, and if a dichroic mirror is used in place of the half mirror 160 in FIG. 13, the first filter 180A can be of course omitted.

Figure 14A:
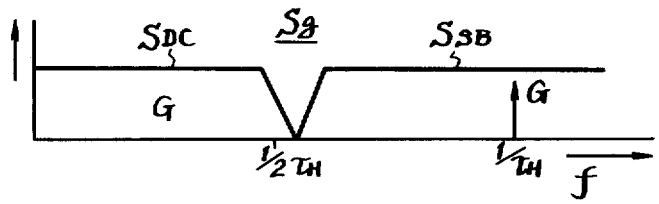
FIGS. 14A to 14F, inclusive, are the frequency spectra of the video signals including the phase relationships of DC components.

By disposing, in the optical paths, the first and second color filters 180A and 180B which have the color selectivities as described above, a desired color separated image of the object 140 is projected on the CCDs 100A and 100B, respectively. That is, only the green color light component of the object is projected on the CCD 100A, so that the video signal $S_g$ obtained at an output terminal 110A, led out from the CCD 100A, has the frequency spectra shown in FIG. 14A. In this case, in order to prevent the occurrence of a sampling error by the side band components of the green color component, the band and sampling frequency $f_c (= 1/\tau_H)$ in the Dc component $S_{DC}$ of the green color light are previously selected. The band of the DC component $S_{DC}$ is required to be such an extent of 3.0 to 5.0 MHz to avoid the deterioration of resolution. In the example, the band of the DC component $S_{DC}$ is selected about 3.5 MHz. Accordingly, the minimum value of the sampling frequency which will prevent the occurrence of any sampling error is 7.0 MHz.

Figure 14B:
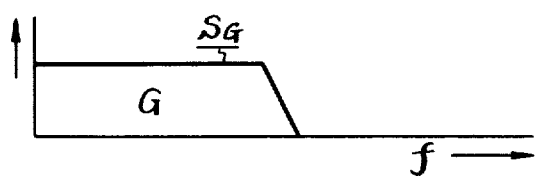

The video signal $S_g$ having the frequency spectrum relation described above is applied to a low pass filter 240 so as to eliminate the side band component $S_{SB}$ therefrom. The output signal from the low pass filter from which the side band component $S_{SB}$ is eliminated as shown in FIG. 14B is transmitted through a delay circuit 250 to an output terminal 260G. As a result, from the output terminal 260G, there is obtained the green color signal $S_G$. In this case, the delay circuit 250 is provided to compensate for the time delay caused by a circuit provided in the signal processing system which will be described later.

The signal systems for the red and blue color signals $S_R$ and $S_B$ will be now described. In FIG. 13, a dotted line block 300R designates a signal system for obtaining the red color signal $S_R$ and a dotted line block 300B designates a signal system for obtaining the blue color signal $S_B$, respectively. Both the signal systems 300R and 300B are the same in circuit construction, so that one of the signal systems, for example, the signal system 300R will be described, and the description on the other signal system 300B will be omitted, but the corresponding parts of the latter are shown with the letter "B" instead of "R" in the former.

Since the second color filter 180B passes the red and blue color lights R and B as described previously, red and blue color video signal components $S_r$ and $S_b$ are obtained at an output terminal 110B. In this case, the components $S_r$ and $S_b$ are continuous, alternative and shifted in phase by 180° at every horizontal scanning line. Thus, the components $S_r$ and $S_b$ are supplied to switching circuits 310R and 310B to be separated, respectively.

Since the green color component $S_g$ is not modulated any by the first color filter 180A, its carrier frequency is $1/\tau_H$. The red and blue color components $S_r$ and $S_b$ are modulated by the first and second sections 220a and 220b of the color filter 180B, so that their carrier frequency is $\frac{1}{2}\tau_H$. Further, in the embodiment, the band of the DC component of the green color G is selected relatively wide.

Figure 14C:
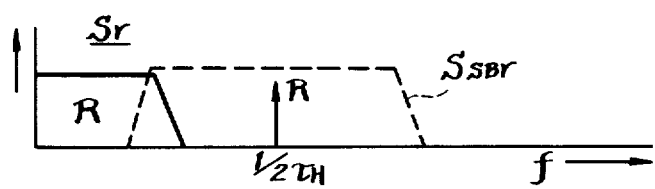
Figure 14D:
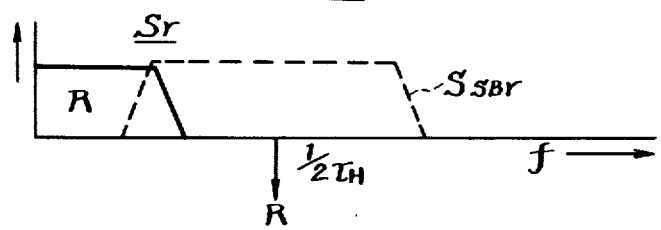
Figure 14E:
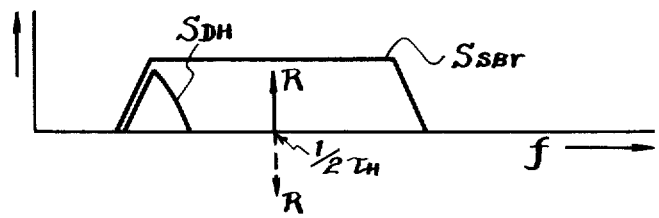

If the frequency spectra of the component $S_r$ obtained during the odd numbered horizontal scanning period is shown in FIG. 14C, the component $S_r$ obtained during the even numbered horizontal scanning period has the frequency spectra shown in FIG. 14D. In this case, since the phase difference of 180° is given to the color components, the phase of the red color R is reverse. Therefore, the output signal $S_r$ from the switching circuit 310R is supplied to a low pass filter 320R for extracting the DC component $S_{DC}$ thereof. The DC component $S_D$, and the component $S_r$ which is not restricted in pass band are applied to a subtracter 330R which then produces a side band component $S_{SB}$, shown in FIG. 14E. However, a slight amount of the high band component $S_{DH}$ of the DC component $S_{DC}$ remains in the low band side of the side band component $S_{SB}$. A delay circuit 340R connected to the output side of the switching circuit 310R compensates for the time delay caused by the low pass filter 320R.

Figure 14F:
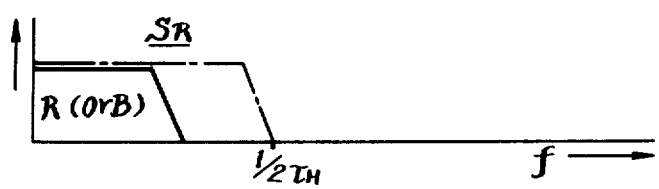

The output signal from the subtracter 330R is supplied through a delay circuit 350R which delays a signal applied thereto by one horizontal scanning period (1H) to an adder 360 which is also supplied with the output from the delay circuit 340R, so that the adder 360R produces a color signal $S_R$ at a terminal 260R in which the adjacent side band components are cancelled and hence there is no side band component as shown in FIG. 14F. That is, by this signal processing with the utilization of vertical correlation, and without the red color signal $S_R$ having sampling error, the band of the DC component $S_{DC}$ of the red color R can be expanded to $\frac{1}{2}\tau_H$. As a result, when the band is expanded to $\frac{1}{2}\tau_H$, it is 3.5 MHz ($= \frac{1}{2}\tau_H$). Thus, the band becomes an ideal signal band.

From the video signal $S_b$, there is obtained the blue color signal $S_B$ without sampling error for the same reason that the band of the blue color signal $S_B$ (DC component $S_{DC}$) is also expanded to $\frac{1}{2}\tau_H$.

It is also possible that the output signals obtained at the terminals 260R, 260G and 260B are supplied to a matrix circuit (not shown in FIG. 13) which then produces the luminance signal and the color difference signals of, for example, the NTSC system.

A pair of color filters 180A' and 180B' shown in FIGS. 15A and 15B can be used to construct a further embodiment of the present invention shown in FIG. 17. That is, each of the color filters 180A' and 180B' have filter sections which permit the passage of green light G arranged at every other 1H. The first color filter 180A' has for odd numbered horizontal scanning lines 210, a light permeable section 370a which permits the passage of green color light G and for even numbered horizontal scanning lines 210b a plurality of divided sections in the horizontal direction where the color lights which are passed are selected to be the same as those of the sections on the even numbered horizontal scanning lines of the color filter 180B, shown in FIG. 12B.

The second color filter 180B' is substantially the same as the color filter 180B shown in FIG. 12B except that the filter sections on the even numbered lines 210b of the latter are replaced with light permeable sections 370b which permit the passage of green color light G.

When the first and second color filters 180A' and 180B' are used, in order to eliminate sampling error by utilizing vertical correlation, the positional relation of the image of the object 140 through the color filters 180A' and 180B' to the CCDs 100A and 100B is shifted by just $\tau_{H/2}$ in space. For example, when the CCDs are shifted, the CCD 100B is shifted by $\tau_{H/2}$ from the CCD 100A, as shown in FIG. 16, to thereby shift the image of the object by $\tau_{H/2}$.

The image of the object 140, being shifted by $\tau_{H/2}$, is delivered to the output terminals 110A and 110B (shown in FIG. 17) as an electric signal having an amplitude in response to the light amount of the image by the supply of the sampling pulses $\phi_A$ and $\phi_B$ when 2-phase CCDs are used as the CCDs 100A and 100B. When video signals $S_A'$ and $S_B'$ obtained from the CCDs 100A and 100B are read out with the sampling pulses $\phi_A$ and $\phi_B$, they are sequentially read out with a phase difference of 180° in time.

If the video signals $S_A'$ and $S_B'$ are read out without the above phase relation, the image of the object 140 is projected after being shifted by $\tau_{H/2}$ in space as shown in FIG. 16, but the video signals $S_A'$ and $S_B'$ from the CCDs 100A and 100B become the same (in phase) in time, which is not preferred for the signal processing described later.

With the embodiment of the invention in which the first and second color filters 180A' and 180B' shown in FIGS. 15A and 15B are used, the components of the red and blue colors R and B are sequentially and alternately obtained, and the components are obtained at every other 1H with respect to the respective CCDs 100A and 100B. Accordingly, in the case of FIG. 17, in order to carry out the signal processing with the signals being divided into the red, green and blue video signals $S_r$, $S_g$, and $S_b$ as in the case of FIG. 13, there is provided a selecting switch 410 which serves to divide the signals $S_g$ and other signals. The selecting switch 410 may be formed of a pair of change-over switches $SW_A$ and $SW_B$ which are switched at every 1H in ganged relation.

Figure 18A:
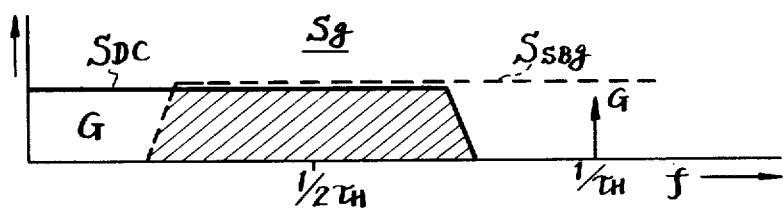
FIGS. 18A to 18E, inclusive, are the frequency spectra of the video signals derived from the example shown in FIG. 17.
Figure 18B:
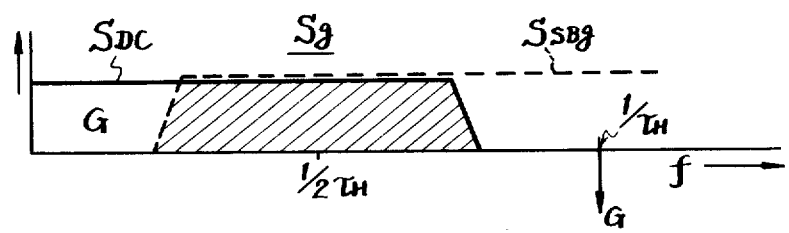

The frequency spectra of the video signal $S_g$ are shown in FIGS. 18A and 18B, respectively. FIG. 18A shows those of the signal $S_g$ which are obtained from the CCD 100A, and FIG. 18B shows those of the signal $S_g$ which are obtained from the CCD 100B, respectively, in which the phase of the signals $S_g$ is reversed, since both the CCDs 100A and 100B are shifted by $\tau_{H/2}$ (or 180°) in time and space.

Figure 18C:
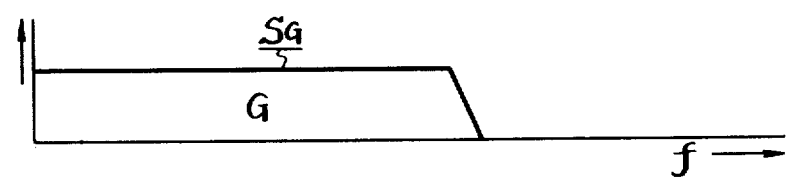

In this example, the band of the DC component of the green color, G, is selected to be 3.5 MHz, and the carrier frequency (sampling frequency $f_c$) is selected to be 4.5 MHz. Therefore, a sampling error is caused in the DC component $S_{DC}$. To avoid the sampling error in this example, there is a signal processing system 300G (refer to a dotted line block in FIG. 17). Since the signal processing system 300G can be formed similar to those 300R and 300B shown in FIG. 13, the parts of the former corresponding to those of the latter are marked by the same reference numerals with the letter "G" instead of "R" and "B", and the description of their operation will be omitted. The green color signal $S_G$ obtained at the terminal 260G is shown in FIG. 18C.

Figure 18D:
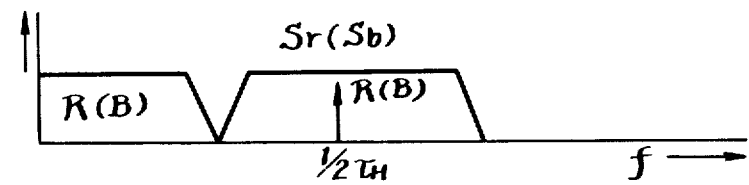
Figure 18E:
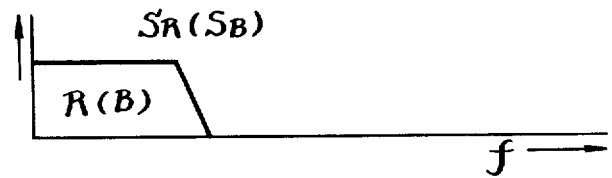

The video signals $S_r$ and $S_b$, shown in FIG. 18D, from the change-over switch $SW_B$ are supplied through gate circuits 420R and 420B to low pass filters 430R and 430B, respectively, to produce desired red and blue color signals $S_R$ and $S_B$ (refer to FIG. 18E) which are transmitted to the output terminals 260R and 260B, respectively. If the band of these signals is selected greater than $\frac{1}{2}\tau_H$, there is produced a sampling error, so that the band is made $\frac{1}{2}\tau_H$ or smaller than the same. In this example, the band can be selected to be 1.1 MHz at the largest.

With the above construction, a good video signal without sampling error can be obtained, and also the number N of picture elements in the horizontal direction can be decreased without deteriorating the horizontal resolution. That is, when the band of the DC component is selected as 3.5 MHz and the sampling frequency $f_c$ is selected as 4.5 MHz, a CCD having about 280 picture elements in the horizontal direction can be used.

It may be apparent that many modifications and variations of the invention could be effected by one skilled in the art without departing from the spirit and scope of the novel concepts thereof.

I claim as my invention:

1. A solid state television camera having a solid state image sensing device including a plurality of individual light sensing units arranged in both horizontal and vertical rows, means for establishing an image light path for casting an image on said image sensing units, a plurality of color filter elements being arranged in horizontal rows within said light path and each being of such size and location with respect to said light sensing units as to pass a portion of said image therethrough and display the same onto respective ones of said image sensing units, said filter elements having transmissibilities selected to pass first and second primary color information, said filter elements being arranged to pass said primary color information in opposing phase relationship as between successive rows and in common phase relationship between alternate rows, means for developing an image signal from each of said individual light sensing units in response to respective portions of an image being displayed thereon through respective ones of said color filter elements, means for processing said image signal into a desired form of video signal, wherein said two primary colors comprise the colors, red and blue, wherein different types of filter elements are disposed in said light path for exposing different light sensing units of said solid state image sensing device, and wherein said image sensing device includes two solid state image sensors, first filter means disposed in the light path of one of said two solid state image sensors permitting the passage therethrough of a common color light information at every odd horizontal line and also permitting the passage of red and blue color light information, alternately, at every even horizontal line, second filter means disposed in the light path of the other solid state image sensor permitting the passage therethrough of common color light information at every even horizontal line and also permitting the passage of red and blue color light information, alternately, at every odd line in opposite order to the order of the red and blue information passed by the first filter at the even horizontal lines.

2. A solid state color camera according to claim 1 wherein said first and second filter means are offset horizontally by a distance of $\tau_{H/2}$ where $\tau_H$ is equal to the width of said vertical rows.

3. A solid state television camera having a solid state image sensing device including a plurality of individual light sensing units arranged in both horizontal rows and vertical columns,
  means for establishing an image light path for casting an image on said image sensing units,
  a filter means having a plurality of color filter elements being arranged in horizontal rows and vertical columns within said light path and each element being of such size and location with respect to said light sensing units as to pass a portion of said image therethrough and display the same onto respective ones of said image sensing units,
  said filter elements having transmissibilities selected to pass first, second and third primary color information,
  all of said filter elements permit the passage of a first primary color information of said object,
  said filter elements being arranged to pass said second and third primary color information in opposing phase relationship as between successive rows and in common phase relationship between alternate rows,
  the alternate filter elements in any given row being a plurality of types of filter elements with certain ones thereof having different light transmission characteristics than certain other ones,
  the ratio of the width of the filter elements which pass said second primary color to the spacing between said elements being a ratio which changes from row to row,
  means for developing an image signal from each of said individual light sensing units in response to respective portions of an image being displayed thereon through respective ones of said color filter elements, and
  means for processing said image signal into a desired form of video signal.

4. A solid state television camera in accordance with claim 3 wherein said second and third primary colors comprise the colors, red and blue.

5. A solid state television camera in accordance with claim 4 wherein said first primary color is green.

6. A solid state television camera according to claim 5 wheerein one set of alternate rows of said filter means have filter elements in the sequence of white, green, yellow, cyan, yellow and green and the other set of alternate rows of said filter means have filter elements in the sequence of green, white, cyan, yellow, cyan and white.

7. A solid state color camera according to claim 2, further comprising an optical spacial filter between said object and said filter means to restrict frequency bands of said red and blue color informations of said object.

8. A solid state color camera according to claim 4, wherein different types of filter elements are disposed in said light path for exposing different light sensing units of said solid state image sensing device.

9. A solid state television camera having three solid state image sensing devices each including a plurality of individual light sensing units arranged in both horizontal rows and vertical columns,
  means for establishing an image path for casting images on said image sensing means,
  a first filter means having a plurality of equal pitch color filter elements being arranged in horizontal rows and vertical columns within said light path and each being of such size and location with respect to a first one of said light sensing units as to pass a portion of said image therethrough and display the same onto respective ones of said image sensing units,
  said filter elements of said first filter means having transmissibility characteristics selected to pass a first primary color at all locations and second and third primary color information at selected locations,
  said filter elements being arranged to pass said second and third primary color information in opposing phase relationship as between successive rows and in common phase relationship between alternate rows,
  a second filter means laterally offset from the first filter means by $\tau/3$ where $\tau$ is the pitch of the filter elements and having a plurality of equal pitch color filter elements arranged in horizontal rows and vertical columns and each being of such size and location with respect to a second one of said image sensing means so as to pass a portion of said image therethrough,
  said filter elements of said second filter means having tranmissible characteristics selected to pass a first primary color at all locations and second and third primary color information at selected locations,
  said filter elements arranged to pass said color information of said second and third primary colors in opposing relationship between successive rows and in common phase relationship between alternate rows,
  a third filter means laterally offset from said second filter means by $\tau/3$ and having a plurality of equal pitch color filter elements arranged in horizontal rows and vertical columns and each being of such size and location with respect to a third one of said image sensing means so as to pass a portion of said image therethrough, said filter elements of said third filter means having transmissible characteristics selected to pass said first primary color at all locations and second and third primary colors information at selected locations,
  said filter elements arranged to pass said color information of said second and third primary colors in opposing relationship between successive rows and in common phase relationship between alternate rows,
  means for developing image signals from each of said individual light sensing units of said three image sensing devices in response to respective portions of an image being displayed thereon through respective ones of said color filter elements, and
  means for processing said image signals into a desired form of video signal.

10. A solid state television camera according to claim 9 wherein the sequence of filter elements in the odd rows of said first filter means are white, cyan, white and in the even rows green, yellow, green.

11. A solid state television camera according to claim 10 wherein the sequence of filter elements in the odd rows of said second filter means are green, yellow, green and in the even rows white, cyan, white.

12. A solid state television camera according to claim 11 wherein the sequence of filter elements in the odd rows of said third filter means are yellow, green, yellow and in the even rows cyan, yellow, cyan.

* * * * *